United States Patent
Ostrick et al.

(10) Patent No.: US 10,018,656 B2
(45) Date of Patent: Jul. 10, 2018

(54) DEVICE, ARRANGEMENT, AND METHOD FOR MEASURING A CURRENT INTENSITY IN A PRIMARY CONDUCTOR THROUGH WHICH CURRENT FLOWS

(71) Applicant: EPCOS AG, Munich (DE)

(72) Inventors: Bernhard Ostrick, Teltow (DE); Carsten Dehoff, Berlin (DE)

(73) Assignee: EPCOS AG, München (DE)

( * ) Notice: Subject to any disclaimer, the term of this patent is extended or adjusted under 35 U.S.C. 154(b) by 64 days.

(21) Appl. No.: 15/032,103

(22) PCT Filed: Oct. 29, 2014

(86) PCT No.: PCT/EP2014/073247
§ 371 (c)(1),
(2) Date: Apr. 26, 2016

(87) PCT Pub. No.: WO2015/071102
PCT Pub. Date: May 21, 2015

(65) Prior Publication Data
US 2016/0266172 A1    Sep. 15, 2016

(30) Foreign Application Priority Data
Nov. 15, 2013  (DE) ................. 10 2013 112 628

(51) Int. Cl.
  *G01R 15/20* (2006.01)
  *G01R 33/07* (2006.01)
  *G01R 19/00* (2006.01)

(52) U.S. Cl.
  CPC ....... *G01R 15/207* (2013.01); *G01R 19/0092* (2013.01)

(58) Field of Classification Search
  CPC ........ G01R 33/07; G01R 33/09; G01R 15/20; G01R 15/202; G01R 15/205; G01R 15/207
  See application file for complete search history.

(56) References Cited

U.S. PATENT DOCUMENTS

| 3,323,057 A | 5/1967 | Harley et al. |
| 6,215,296 B1 | 4/2001 | Arnoux et al. |

(Continued)

FOREIGN PATENT DOCUMENTS

| DE | 10113131 A1 | 9/2002 |
| DE | 10240242 A1 | 3/2004 |

(Continued)

OTHER PUBLICATIONS

Hikazumi, S. et al., "Physics of Ferromagnetic Substance," vol. 1, Revision 5, Shoukabou Book Co., Ltd., 1984, 4 pages.

*Primary Examiner* — Minh N Tang
(74) *Attorney, Agent, or Firm* — Slater Matsil, LLP

(57) ABSTRACT

A device, an arrangement, and a method for measuring a current intensity in a primary conductor through which current flows are disclosed. In an embodiment, an apparatus includes a magnetic field-generating element configured to generate a reference magnetic field; and a magnetic field angle-sensitive element configured to measure an orientation of a total magnetic field, the total magnetic field is produced by overlapping of the primary magnetic field and the reference magnetic field in space, wherein the primary magnetic field and the reference magnetic field are not parallel to one another at a location of the magnetic field angle-sensitive element, and wherein the current intensity of the current flowing through the primary conductor is determinable from the orientation of the total magnetic field in space.

13 Claims, 3 Drawing Sheets

(56) References Cited

U.S. PATENT DOCUMENTS

| | | | |
|---|---|---|---|
| 8,421,453 B2 | 4/2013 | Bauer | |
| 8,779,756 B2 | 7/2014 | Nomura | |
| 8,884,615 B2 * | 11/2014 | Gati | B82Y 25/00 324/252 |
| 9,310,398 B2 * | 4/2016 | Ausserlechner | G01R 35/005 |
| 9,612,262 B1 * | 4/2017 | Nehmeh | G01R 15/202 |
| 2003/0151406 A1 | 8/2003 | Wan et al. | |
| 2005/0156587 A1 | 7/2005 | Yakymyshyn et al. | |
| 2013/0073238 A1 | 3/2013 | Nomura et al. | |
| 2013/0187633 A1 | 7/2013 | Yasui et al. | |

FOREIGN PATENT DOCUMENTS

| | | |
|---|---|---|
| DE | 102011110648 A1 | 2/2013 |
| EP | 0294636 A2 | 12/1988 |
| EP | 0930507 A1 | 7/1999 |
| EP | 1406094 A1 | 4/2004 |
| EP | 1739444 A2 | 1/2007 |
| EP | 2108966 A1 | 10/2009 |
| JP | S64001970 A | 1/1989 |
| JP | H02238372 A | 9/1990 |
| JP | H04210448 A | 7/1992 |
| JP | H05258245 A | 10/1993 |
| JP | H0720218 A | 1/1995 |
| JP | 2004221289 A | 8/2004 |
| JP | 2006047005 A | 2/2006 |
| JP | 2010066262 A | 3/2010 |
| JP | 2010101871 A | 5/2010 |
| JP | 2010243232 A | 10/2010 |
| JP | 2011242270 A | 12/2011 |
| JP | 2011242273 A | 12/2011 |
| JP | 201364663 A | 4/2013 |
| JP | 2013148512 A | 8/2013 |
| JP | 2013200301 A | 10/2013 |
| WO | 2010009761 A1 | 1/2010 |
| WO | 2010106304 A1 | 9/2010 |
| WO | 2013023643 A1 | 2/2013 |

* cited by examiner

DEVICE, ARRANGEMENT, AND METHOD FOR MEASURING A CURRENT INTENSITY IN A PRIMARY CONDUCTOR THROUGH WHICH CURRENT FLOWS

This patent application is a national phase filing under section 371 of PCT/EP2014/073247, filed on Oct. 29, 2014, which claims the priority of German patent application 10 2013 112 628.6, filed Nov. 15, 2013, each of which is incorporated herein by reference in its entirety.

TECHNICAL FIELD

The invention specifies an apparatus for measuring a current intensity in a primary conductor through which current flows. An arrangement and a method for measuring a current intensity are also specified.

BACKGROUND

Resistive, inductive and magnetic solutions are known for measuring current. Resistive solutions are distinguished by a large measurement range combined with a high degree of measurement accuracy at low currents, but can be galvanically isolated only by complicated signal processing and cause interference under certain circumstances owing to a voltage drop at peak loads. Inductive methods utilize the law of induction, for example, in so-called Rogowski coils or current transformers, and are therefore only compatible with alternating current without complicated integrative circuitry. The strength of a magnetic field which is generated by a conductor through which current flows is measured in the case of magnetic current sensors. Therefore, these solutions are compatible with alternating current and direct current.

The magnetic field probes used may be, in particular, Hall sensors, AMR sensors (AMR, "anisotropic magnetoresistance"), GMR sensors (GMR, "giant magnetoresistance") and fluxgate probes. In order to amplify the magnetic field at the measurement location and to shield from external fields, ferromagnetic cores are generally used in this case, but said ferromagnetic cores, on account of the hysteresis in the case of so-called open-loop methods, limit the degree of measurement accuracy at low currents owing to the residual magnetization in the material. In so-called closed-loop methods, the magnet probe is used to keep the magnetization in the core at zero by means of a control group and an additional coil around the core. The measurement accuracy at low currents improves as a result. When using sensitive field strength-sensitive AMR or GMR elements, only measurement in a restricted current range would be possible with an open-loop design since the sensors do not have a large dynamic range on account of the saturation of the elements.

SUMMARY

Embodiments provide an apparatus for measuring a current intensity in a primary conductor through which current flows, which apparatus is distinguished by a high degree of current measurement accuracy over a wide measurement range. Further embodiments provide an arrangement and a method for measuring a current intensity.

An apparatus for measuring a current intensity in a primary conductor through which current flows according to at least one embodiment has a magnetic field-generating element, which generates a reference magnetic field, and a magnetic field angle-sensitive element. The magnetic field-angle sensitive element measures the orientation of a total magnetic field in space, which total magnetic field is produced by overlapping of the reference magnetic field and a primary magnetic field which is generated by the primary conductor through which current flows. The primary magnetic field and the reference magnetic field are preferably not parallel to one another at the location of the magnetic field angle-sensitive element. In other words, the magnetic field lines of the primary magnetic field at the position of the magnetic field angle-sensitive element are preferably not parallel to the magnetic field lines of the reference magnetic field. The current intensity of the current flowing through the primary conductor can be determined from the orientation of the total magnetic field in space. In particular, the magnetic field angle-sensitive element, which can be connected to an evaluation apparatus, for example, can measure the orientation of the total magnetic field, as a result of which the current intensity of the current flowing through the primary conductor can be determined.

In this case, the magnetic field angle-sensitive element is not designed to measure the magnitude of the magnetic field strength or flux density, but rather to measure the direction of the magnetic field strength and/or flux density of the total magnetic field. In this case, the magnetic field-generating element is preferably arranged such that the primary magnetic field and the reference magnetic field are at an angle in relation to one another at the location of the magnetic field angle-sensitive element, so that the magnetic field angle-sensitive element measures the orientation of the total magnetic field which is produced by overlapping of the primary magnetic field and the reference magnetic field.

If the magnitude of the reference magnetic field is known, the measured field angle is a measure of the field strength of the primary magnetic field and therefore of the current flowing through the primary conductor through which current flows.

Advantageously, magnetic angle measurements with a very high degree of accuracy are possible, so that the apparatus has a high degree of current measurement accuracy over a wide measurement range. A further advantage of the apparatus described here is the result of it being possible to adapt the measurement range of the apparatus to the set requirements in a simple manner by changing the field strength of the reference magnetic field which is generated by the magnetic field-generating element.

According to a further embodiment, the magnetic field angle-sensitive element has at least two Hall elements. According to a particularly preferred embodiment, the magnetic field angle-sensitive element has precisely two Hall elements. Furthermore, it is possible for the magnetic field angle-sensitive element to consist of two Hall elements. Advantageously, the two Hall elements each have a sensor axis, wherein the two Hall elements are arranged in one plane and with their sensor axes at a right angle in relation to one another. The magnetic field angle-sensitive element can also comprise three Hall elements which are arranged with their sensor axes respectively orthogonal in relation to one another.

According to a further embodiment, the magnetic field angle-sensitive element has one or more AMR bridges (AMR, "anisotropic magnetoresistance") or consists of one or more AMR bridges. By way of example, the AMR bridge can comprise a large number of AMR strips which can form resistors of one or more Wheatstone bridges. Furthermore, it is possible for the magnetic field angle-sensitive element to have or consist of one or more GMR bridges (GMR, "giant magnetoresistance") and/or one or more TMR bridges (TMR, "tunnel magnetoresistance").

According to a further embodiment, the magnetic field angle-sensitive element has one or more spin-valve GMR bridges and/or one or more spin-valve TMR bridges. Furthermore, the magnetic field angle-sensitive element can consist of one or more spin-valve GMR bridges and/or of one or more spin-valve TMR bridges.

According to a further embodiment, the magnetic field-generating element has a permanent magnet. The permanent magnet can have a bar shape, ring shape or another geometric shape, depending on requirements. It is also possible for the magnetic field-generating element to consist of a permanent magnet.

According to a further embodiment, the magnetic field-generating element has a coil or consists of a coil. For example, the magnetic field angle-sensitive element can be arranged within the magnetic field-generating element, for example, within the coil. In this way, it is advantageously possible to achieve a situation in which the primary magnetic field and the reference magnetic field are not parallel to one another at the location of the magnetic field angle-sensitive element.

According to a further embodiment, the reference magnetic field is selected such that the magnitude of said reference magnetic field corresponds to the primary magnetic field at maximum current $I_{max}$ and the direction of said reference magnetic field is arranged perpendicular to the primary magnetic field. As a result, the angular range, which is to be measured, for primary currents between $I=-I_{max}$ and $I=I_{max}$ lies between $-45°$ and 45.

The apparatus described here for measuring a current intensity in a primary conductor through which current flows has a series of advantages. For example, angular measurements to a degree of angular accuracy of $0.1°$ are possible with modern spin valve-based, magnetoresistive bridges. Therefore, the current, disregarding other interference variables, can be measured with a degree of measurement accuracy of below $0.25\% \cdot I_{max}$. The described apparatus is distinguished, in particular, by the use of the high degree of accuracy of magnetic angle measurements for current measurement. There is also advantageously an increase in the dynamic range, in particular when using AMR, GMR or TMR magnetic field angle-sensitive elements. Furthermore, it is possible to changeover the measurement range by varying the magnetic field-generating element.

According to a further embodiment, the apparatus has a hard-magnetic element which at least partially surrounds the primary conductor and/or the magnetic field-generating element. The hard-magnetic element can be, for example, a magnetic core which is composed of a hard-magnetic material, and serves to magnetically shield the magnetic field angle-sensitive element. The magnetic shielding can have the effect that magnetic fields which would act on the magnetic field angle-sensitive element and/or the magnetic field-generating element can be at least partially shielded or at least weakened.

According to a further embodiment, the hard-magnetic element is in the form of a toroidal core which is opened by an air gap. The toroidal core preferably at least partially surrounds the primary conductor. The magnetic field angle-sensitive element can be arranged, for example, in the air gap in the open toroidal core.

According to a further embodiment, the hard-magnetic element at least partially surrounds the magnetic field-generating element and the magnetic field angle-sensitive element for shielding external magnetic fields. By way of example, the hard-magnetic element can be in the form of a U and can be arranged in relation to the primary conductor in such a way that the hard-magnetic element and the primary conductor fully surround the magnetic field-generating element and the magnetic field angle-sensitive element.

The invention further specifies an arrangement of an apparatus for measuring a current intensity, wherein the apparatus comprises an apparatus having one or more features of the abovementioned embodiments and is arranged in relation to a primary conductor through which current flows in such a way that the current intensity of the current flowing through the primary conductor is measured from the result of determining the orientation of the total magnetic field in space, which total magnetic field is produced by a reference magnetic field overlapping a primary magnetic field which is generated by the primary conductor.

The invention further specifies a method for measuring a current intensity in a primary conductor through which current flows. An apparatus having one or more features of the abovementioned embodiments can be used in said method, for example. The embodiments described above and in the text which follows therefore equally apply for the apparatus for measuring a current intensity and for the method for measuring the current intensity.

A primary conductor through which current flows and which generates a primary magnetic field is provided according to a further embodiment. An apparatus which has a magnetic field-generating element which generates reference magnetic field is further provided. The apparatus is arranged in relation to the primary conductor in such a way that the magnetic field angle-sensitive element measures the orientation of a total magnetic field, which is produced by overlapping of the primary magnetic field and the reference magnetic field, in space. In this case, the primary magnetic field and the reference magnetic field are preferably not parallel to one another at the location of the magnetic field angle-sensitive element. The current intensity of the current flowing through the primary conductor can be determined from the orientation of the total magnetic field in space.

According to a further embodiment, the field strength of the reference magnetic field is varied for adapting the measurement range of the apparatus.

According to a further embodiment, the reference magnetic field is tracked using an electronics system in order to keep the measured orientation of a total magnetic field constant.

According to a further embodiment, the magnitude of the field strength of the reference magnetic field is selected in such a way that it corresponds to the field strength of the primary magnetic field at maximum current.

BRIEF DESCRIPTION OF THE DRAWINGS

Further advantages and advantageous embodiments of the apparatus for measuring a current intensity in a primary conductor through which current flows can be gathered from the embodiments which are described below in conjunction with FIGS. 1 to 5, in which.

DETAILED DESCRIPTION OF ILLUSTRATIVE EMBODIMENTS

In the exemplary embodiments and figures, identical or identically acting constituent parts can respectively be provided with the same reference symbols. The illustrated elements and the size relationships of said elements in relation to one another should not be regarded as true to scale in principle. Rather, individual elements, such as components and regions, for example, may be illustrated with exaggerated thickness or size dimensions in order to enable better illustration and/or in order to afford better understanding.

Figure 1:
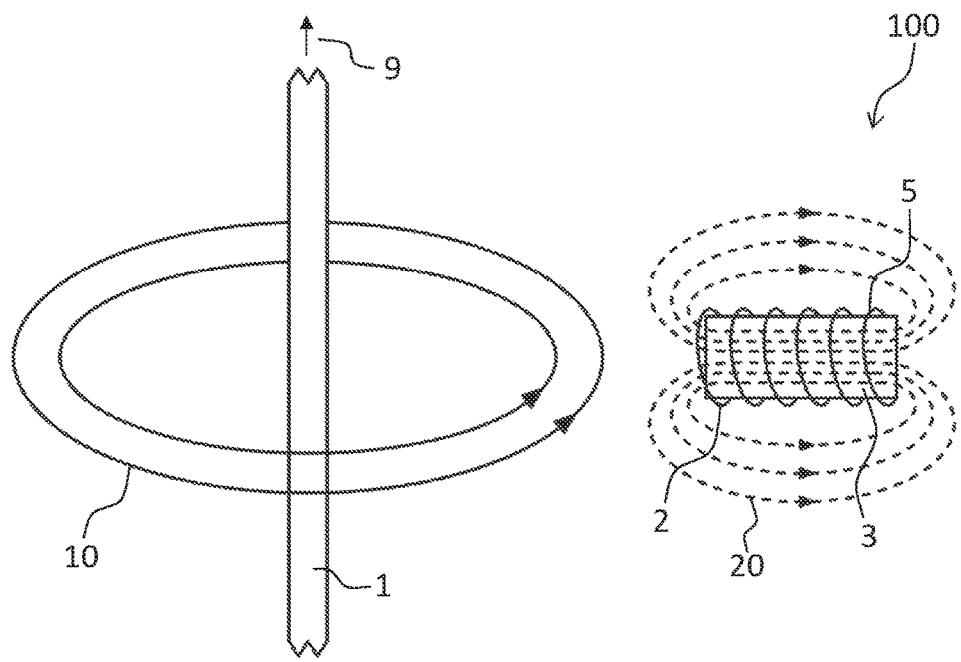
FIG. 1 shows a schematic view of an apparatus for measuring a current intensity in a primary conductor through which current flows according to one exemplary embodiment.

FIG. 1 shows a schematic view of an apparatus 100 for measuring a current intensity according to one exemplary embodiment. The apparatus 100 has a magnetic field-generating element 2 which generates a schematically indicated reference magnetic field 20. The magnetic field-generating element 2 is in the form of a coil 5 in this exemplary embodiment. As an alternative, the magnetic field-generating element 2 can be designed, for example, as a permanent magnet. The apparatus 100 further has a magnetic field angle-sensitive element 3. In the exemplary embodiment shown, the magnetic field angle-sensitive element 3 is arranged within the coil 5. In order to measure the current intensity in a primary conductor 1 through which a current $I_P$ flows in the current direction 9 which is identified by reference symbol 9 and which, as a result, generates a schematically indicated primary magnetic field 10, the apparatus 100 is arranged in such a way that the primary magnetic field 10 and the reference magnetic field 20 are not parallel to one another at the location of the magnetic field angle-sensitive element 3. The magnetic field angle-sensitive element 3 measures the orientation of a total magnetic field which is produced by overlapping of the primary magnetic field 10 and the reference magnetic field 20. The current intensity of the current $I_P$ flowing through the primary conductor 1 can be determined from the orientation of the total magnetic field in space.

In particular, the field angle of the total magnetic field, which field angle is measured by means of the magnetic field angle-sensitive element 3, is a measure of the field strength of the primary magnetic field 10 and therefore of the current $I_P$ flowing through the primary conductor 1 through which current flows.

The apparatus has a galvanically isolated design and is suitable for measuring alternating current and direct current. Said apparatus is distinguished, in particular, by a high degree of current measurement accuracy over a wide measurement range since magnetic angular measurements with a very high degree of accuracy are possible.

Figure 2:
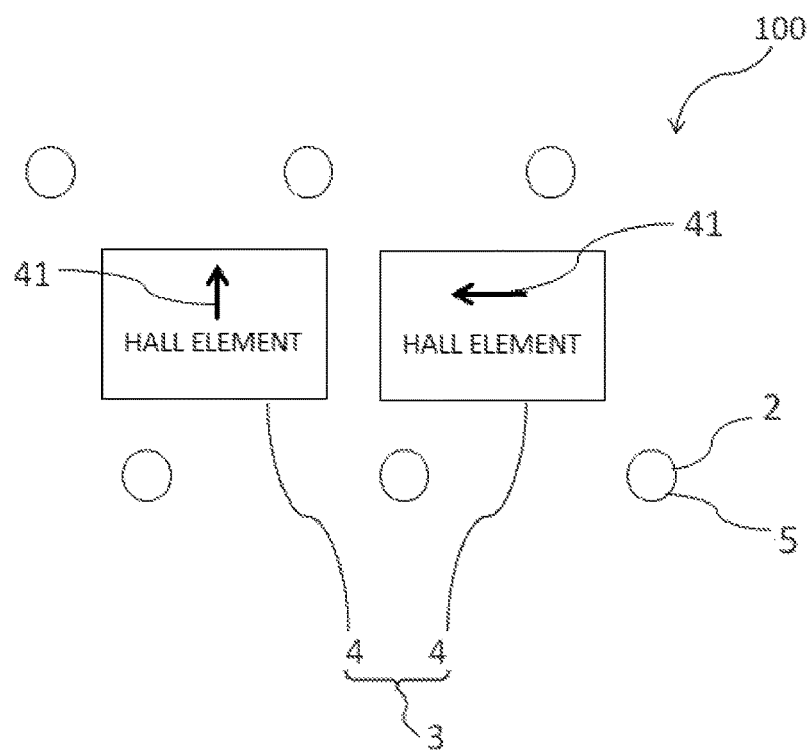
FIG. 2 shows a schematic sectional view through an apparatus for measuring a current intensity according to a further exemplary embodiment.

FIG. 2 shows a schematic sectional view through an apparatus 100. The magnetic field-generating element 2 is designed as a coil 5. In this exemplary embodiment, the magnetic field angle-sensitive element 3 has two Hall elements 4 which are arranged within the coil 5. The Hall elements 4 each have a sensor axis 41, which sensor axes are arranged orthogonally to one another. It is further possible for a plurality of Hall elements 4 which are arranged parallel to one another to be provided for each sensor axis 41, and for the measurement signals of these Hall elements 4 to be averaged. As an alternative to the Hall elements 4, the magnetic field angle-sensitive element 3 can also have or consist of an AMR bridge, a GMR bridge, a TMR bridge, a spin-valve GMR bridge and/or a spin-valve TMR bridge.

Figure 3:
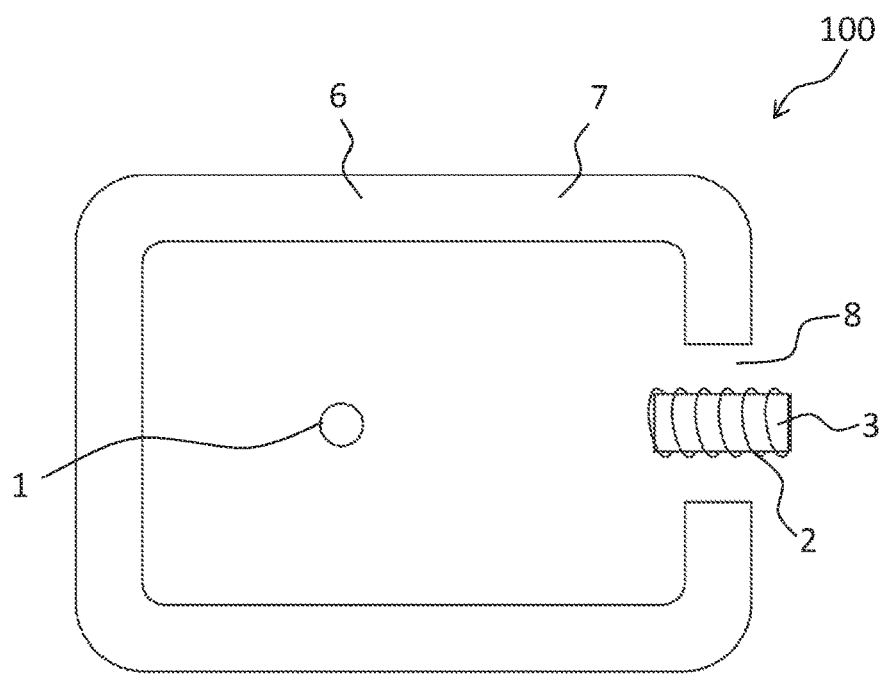
FIGS. 3 and 4 show schematic views of an apparatus for measuring a current intensity in a primary conductor through which current flows, having a hard-magnetic element, which serves for shielding purposes, according to further exemplary embodiments.

FIG. 3 shows an apparatus 100 for measuring a current intensity in a primary conductor 1 through which current flows according to a further exemplary embodiment. The apparatus 100 comprises a magnetic field-generating element 2 which generates a reference magnetic field 20, a magnetic field angle-sensitive element 3 which is in the form of a coil, and a hard-magnetic element 6 which surrounds the primary conductor 1. In this case, the hard-magnetic element 6 is in the form of a toroidal core 7 which has an air gap 8 in which the magnetic field-generating element 2 and the magnetic field angle-sensitive element 3 are arranged. In this case, the hard-magnetic element 7 serves to shield external magnetic fields. The hard-magnetic element 6 can have the effect that magnetic fields which would act on the magnetic field angle-sensitive element 3 and/or the magnetic field-generating element 2 can be at least partially shielded.

Figure 4:
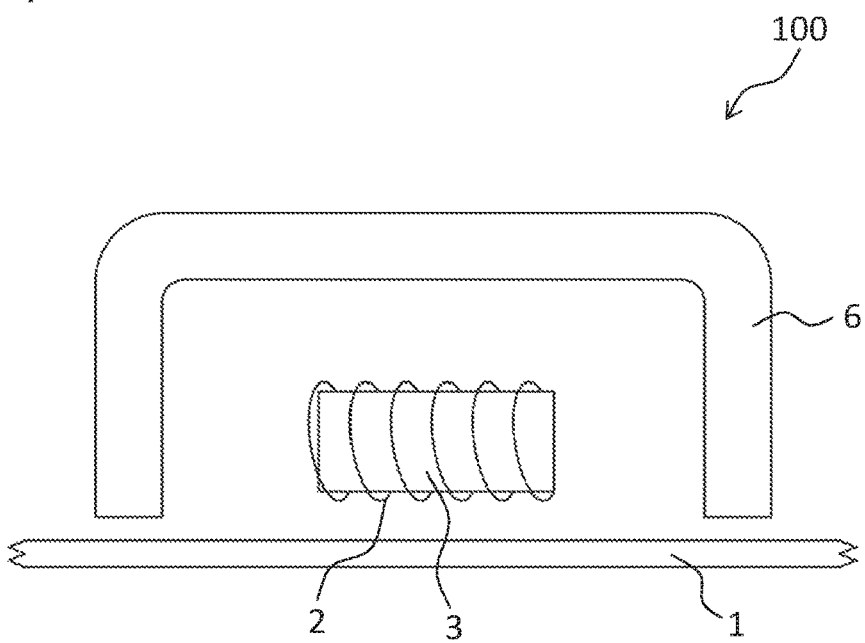

FIG. 4 shows an apparatus 100 for measuring a current intensity in a primary conductor 1 through which current flows and which has a magnetic field-generating element 2, a magnetic field angle-sensitive element 3 and a hard-magnetic element 6. The hard-magnetic element 6 is in the form of a U and has two opposing limbs and also a part which connects the two limbs. It is arranged in relation to the primary conductor 1 in such a way that the hard-magnetic element 6 and the primary conductor 1 surround the magnetic field-generating element 2 and the magnetic field angle-sensitive element 3, so that external fields can be shielded. In other words, the hard-magnetic element 6 is arranged on the primary conductor 1 in such a way that the exposed ends of the opposing limbs of the hard-magnetic element 6 are arranged directly adjacent to the primary conductor 1, and that the magnetic field-generating element 2 and the magnetic field angle-sensitive element 3 are located within this arrangement.

Figure 5:
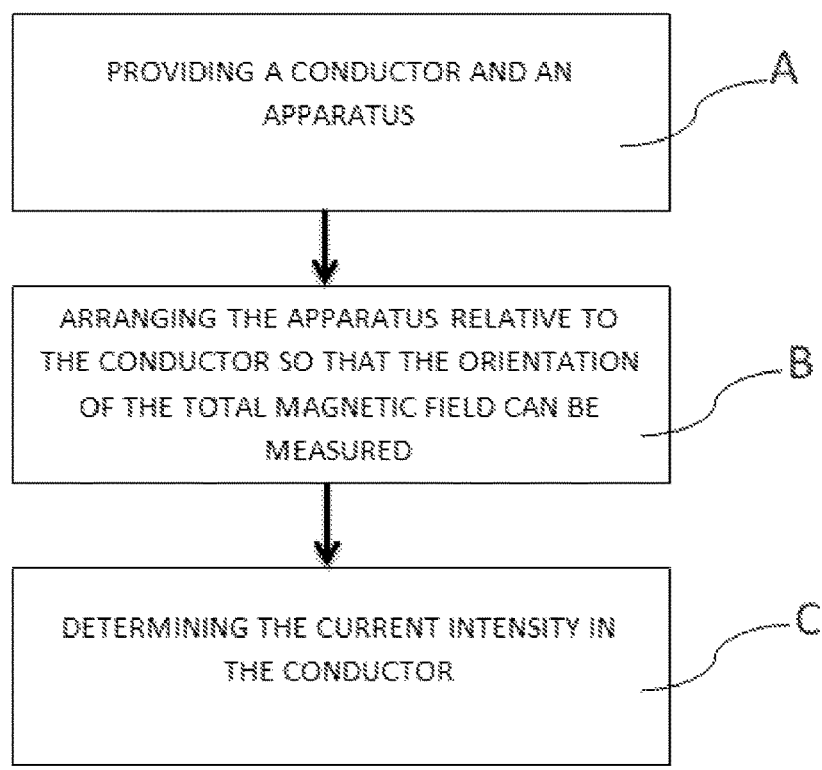
FIG. 5 shows a method for measuring a current intensity in a primary conductor through which current flows according to a further exemplary embodiment.

FIG. 5 shows a method for measuring a current intensity in a primary conductor 1 through which current flows according to one exemplary embodiment. In this case, a primary conductor 1 through which current flows and which generates a primary magnetic field 10, and also an apparatus 100, which has a magnetic field-generating element 2 and a magnetic field angle-sensitive element 3, are provided in a first method step A. In a subsequent method step B, the apparatus 100 is arranged in relation to the primary conductor 1 in such a way that the magnetic field angle-sensitive element 3 measures the orientation of a total magnetic field, which is produced by overlapping of the primary magnetic field 10 and the reference magnetic field 20, in space. In this case, the primary magnetic field 10 and the reference magnetic field 20 are not parallel to one another at the location of the magnetic field angle-sensitive element 3. In a further method step C, the current intensity of the current flowing through the primary conductor 1 is determined from the orientation of the total magnetic field in space.

As an alternative or in addition, the exemplary embodiments shown in the figures can have further features according to the embodiments of the general description. The invention is not restricted to said exemplary embodiments by the description on the basis of said exemplary embodiments, but rather encompasses any novel feature and also any combination of features, which includes, in particular, any combination of features in the patent claims, even if this feature or this combination itself is not explicitly specified in the patent claims or exemplary embodiments.

The invention claimed is:

1. A method for measuring a current intensity in a primary conductor, the method comprising:
   providing the primary conductor configured to generate a primary magnetic field;
   providing an apparatus for measuring the current intensity in the primary conductor, wherein the apparatus includes a magnetic field-generating element configured to generate a reference magnetic field and a magnetic field angle-sensitive element configured to measure an orientation of a total magnetic field, and wherein the apparatus is configured to determine the current intensity of a current flowing through the primary conductor when the primary magnetic field and the reference magnetic field are not parallel to one another at a location of the magnetic field angle-sensitive element;
   arranging the apparatus in relation to the primary conductor in such a way that the magnetic field angle-sensitive element measures the orientation of the total magnetic field, which is produced by overlapping of the primary magnetic field and the reference magnetic field in space, wherein the primary magnetic field and the reference magnetic field are not parallel to one another at the location of the magnetic field angle-sensitive element; and
   determining the current intensity of the current flowing through the primary conductor from the orientation of the total magnetic field in space, wherein a magnitude of a field strength of the reference magnetic field is set to a value corresponding to a magnitude of a field strength of the primary magnetic field at maximum current.

2. The method according to claim 1, wherein the apparatus further comprises a hard-magnetic element, and wherein the hard-magnetic element at least partially surrounds the primary conductor and/or the magnetic field-generating element.

3. The method according to claim 2, wherein the hard-magnetic element at least partially surrounds the magnetic field-generating element and the magnetic field angle-sensitive element, the hard-magnetic element configured to shield external magnetic fields.

4. The method according to claim 2, wherein the hard-magnetic element is U-shaped.

5. The method according to claim 4, wherein the hard-magnetic element is arranged in relation to the primary conductor such that the hard-magnetic element and the primary conductor surrounds the magnetic field-generating element and the magnetic field angle-sensitive element.

6. The method according to claim 2, wherein the hard-magnetic element comprises two opposed limbs having exposed ends and a part which connects the two limbs, and wherein the exposed ends are arranged directly adjacent to the primary conductor.

7. The method according to claim 2, wherein the hard-magnetic element is in the form of a toroidal core with an air gap, wherein the toroidal core at least partially surrounds the primary conductor, and wherein the magnetic field angle-sensitive element is arranged in the air gap.

8. The method according to claim 1, wherein the magnetic field angle-sensitive element comprises two Hall elements.

9. The method according to claim 1, wherein the magnetic field angle-sensitive element comprises an AMR bridge, GMR bridge and/or TMR bridge.

10. The method according to claim 1, wherein the magnetic field angle-sensitive element comprises a spin-valve GMR bridge and/or a spin-valve TMR bridge.

11. The method according to claim 1, wherein the magnetic field-generating element comprises a permanent magnet.

12. The method according to claim 1, wherein the magnetic field-generating element comprises a coil.

13. The method according to claim 1, wherein the magnetic field angle-sensitive element is arranged within the magnetic field-generating element.

* * * * *